(12) United States Patent
Hayashi et al.

(10) Patent No.: US 7,956,469 B2
(45) Date of Patent: Jun. 7, 2011

(54) LIGHT EMITTING DEVICE AND METHOD OF MANUFACTURING THE SAME

(75) Inventors: Masaki Hayashi, Anan (JP); Yuji Okada, Tokushima (JP); Koji Kuroda, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/179,327

(22) Filed: Jul. 24, 2008

(65) Prior Publication Data

US 2009/0026480 A1 Jan. 29, 2009

(30) Foreign Application Priority Data

Jul. 27, 2007 (JP) ................................ P 2007-195859
Jul. 15, 2008 (JP) ................................ P 2008-183817

(51) Int. Cl.
*H01L 21/31* (2006.01)
*H01L 21/469* (2006.01)
(52) U.S. Cl. ......... 257/767; 257/762; 438/650; 438/687
(58) Field of Classification Search .................. 257/767, 257/762, E33.063; 438/650, 687
See application file for complete search history.

(56) References Cited

U.S. PATENT DOCUMENTS

2007/0023777 A1* 2/2007 Sonobe et al. ................ 257/103
2008/0169752 A1* 7/2008 Hattori et al. ................. 313/503

FOREIGN PATENT DOCUMENTS

| JP | 3-32033 A | 2/1991 |
| JP | 7-66235 A | 3/1995 |
| JP | 10-130882 A | 5/1998 |
| JP | 2006-324438 A | 11/2006 |

* cited by examiner

*Primary Examiner* — Zandra Smith
*Assistant Examiner* — Telly D Green
(74) *Attorney, Agent, or Firm* — Birch, Stewart, Kolasch & Birch, LLP

(57) ABSTRACT

Provided is a light emitting device with high extraction efficiency, in which absorption of light by a conductive wire is prevented effectively. The light emitting device includes a conductive wire electrically connecting an electrode of a light emitting element and an electrically conductive member. The surface of the bonding portion of the conductive wire between the conductive wire and at least one of the electrode of the light emitting element and the electrically conductive member is covered with a metal film. The reflectivity of the metal film is higher than that of the conductive wire at the emission peak wavelength of the light emitting element.

22 Claims, 11 Drawing Sheets

A - A

LIGHT EMITTING DEVICE AND METHOD OF MANUFACTURING THE SAME

BACKGROUND OF THE INVENTION

1. Technical Field

The present invention relates to a light emitting device including a light emitting element, and more particularly, to a light emitting device having high light extraction efficiency of light emitted from the light emitting element.

2. Background Art

Among ways to improve the light extraction efficiency of a light emitting device, enhancement of the reflectance in a package where a light emitting element to be mounted has been actively conducted. Provision of a metal film on the light incident surface receiving light from the light emitting element is one of the known methods to enhance the reflectivity, as disclosed in JP2006-324438A for example. In the light emitting device disclosed in JP2006-324439A, silver plating is applied on the mounting surface, which is a heat sink, so as to use the mounting surface as a light reflecting member, thus improves the light extraction efficiency of the light from the light emitting element.

In a case where a light emitting element is mounted on a light emitting device, typically, the light emitting element is die-bonded to a package having a lead electrode made of a metal plate such as Cu, and the light emitting element and the lead electrode are wire-bonded with a conductive wire made of Au and the like. At this time, if a blue light emitting element is used as the light emitting element, the extraction efficiency of the light emitting device will be decreased, due to attenuation of blue light by absorption by Cu or Au. Particularly, the conductive wire is connected directly to the light emitting element and also placed above, across the light emitting surface side of the light emitting element. Therefore, absorption of light by the conductive wire is not negligible. If the conductive wire is made of a metal (e.g. Ag) having a high reflectivity for blue light, absorption of light by the conductive wire can be greatly reduced. However, bonding between the light emitting element and the lead electrode is low and sufficient bonding strength cannot be obtained.

A composite bonding wire formed with a core material and a covering material covering the core material is known as a conductive wire, which can be used for wire bonding in a semiconductor device, as disclosed in JP H03-32033A, JP H07-66235A, and JP H10-130882A for example. In these composite wires, a high-strength material is used for the core material to enhance mechanical strength of the composite wire, and an electrically conductive material which can easily bond with the covering material is used to ensure bonding strength and electrical conductivity.

Accordingly, it is considered to suppress absorption of light by the conductive wire while maintaining sufficient bond strength by using a composite wire in the light emitting device. For example, with a composite wire formed with a core material made of Au covered by a covering material made of Ag, bond strength can be secured by Au and blue light can be reflected by Ag.

In a case where a light emitting device is fabricated using a composite wire, the expected degree of improvement in the light extracting efficiency of the light emitting device cannot be achieved.

In a case where a first bond 150 of ball bonding is formed by using a composite wire as shown in FIG. 14, even when a composite wire 140 formed of the core material 142 made of Au covered with the covering material 144 made of Ag is used, the covering member 144 does not exist on the surface of the first bond 150. This is because at the time of forming the first bond 150, the core material 142 and the covering member 144 are melted and mixed together when an end portion of the composite wire 140 is melted into a ball shape. As shown in the figure, when the first bond 150 is connected to the electrode 112 of the light emitting element 110, Au exposed on the surface of the first bond 150 absorbs light near the light emitting element 110, so that the light extraction efficiency cannot be improved efficiently.

A second bond 160 of ball bonding shown in FIG. 15 is connected by thermally compressing the composite wire 140 to a lead electrode 130, but at this time, a part of the covering material 144 subjected to the thermal compress may be detached to expose the core material 142.

SUMMARY OF THE INVENTION

Accordingly, an object of the present invention is to provide a light emitting device with high extraction efficiency, in which absorption of light by a conductive wire is prevented effectively, and a method of manufacturing the light emitting device.

A light emitting device of the present invention includes a conductive wire for electrically connecting an electrode of a light emitting element to an electrically conductive member. The surface of the conductive wire at a bonding portion between the conductive wire and at least one of the electrode of the light emitting element and the electrically conductive member is covered with a metal film. The reflectivity of the metal film is higher than reflectivity of the conductive wire at a emission peak wavelength of the light emitting element.

In the light emitting device, light reached the bonding portion of the conductive wire is reflected by the metal film having higher reflectivity than that of the conductive wire. Therefore, absorption of light by the conductive wire can be prevented and the light extraction efficiency of the light emitting device can be improved.

A method of manufacturing the light emitting device of the present invention concerns manufacturing a light emitting device having a conductive wire which connects an electrode of a light emitting element to an electrically conductive member, and the method includes a wire bonding step to connect an electrode of the light emitting element to the electrically conductive member with the conductive wire, and an electroplating step to cover the electrically conductive member and the conductive wire with a metal film by way of electroplating.

In this method, the electroplating step is performed after the wire bonding step. Thus, the metal film can be formed on the surface of the bonding portion of the conductive wire. Further, with the electroplating, the metal film is not formed on the surface of the light emitting element which is not conductive. Thus, detachment of the light extraction efficiency of the light emitting element due to the metal film can be eliminated.

According to the light emitting device of the present invention, absorption of light by the conductive wire is reduced, so that light extraction efficiency of the light emitting device can be improved. Further, according to the method of manufacturing the same, the metal film can be formed efficiently on the surface of the conductive wire.

Preferred embodiments of a light emitting device and a method of manufacturing the same according to the present invention will now be described below with reference to the accompanying drawings.

DETAILED DESCRIPTION OF THE PREFERABLE EMBODIMENTS

Embodiment 1

Figure 1:
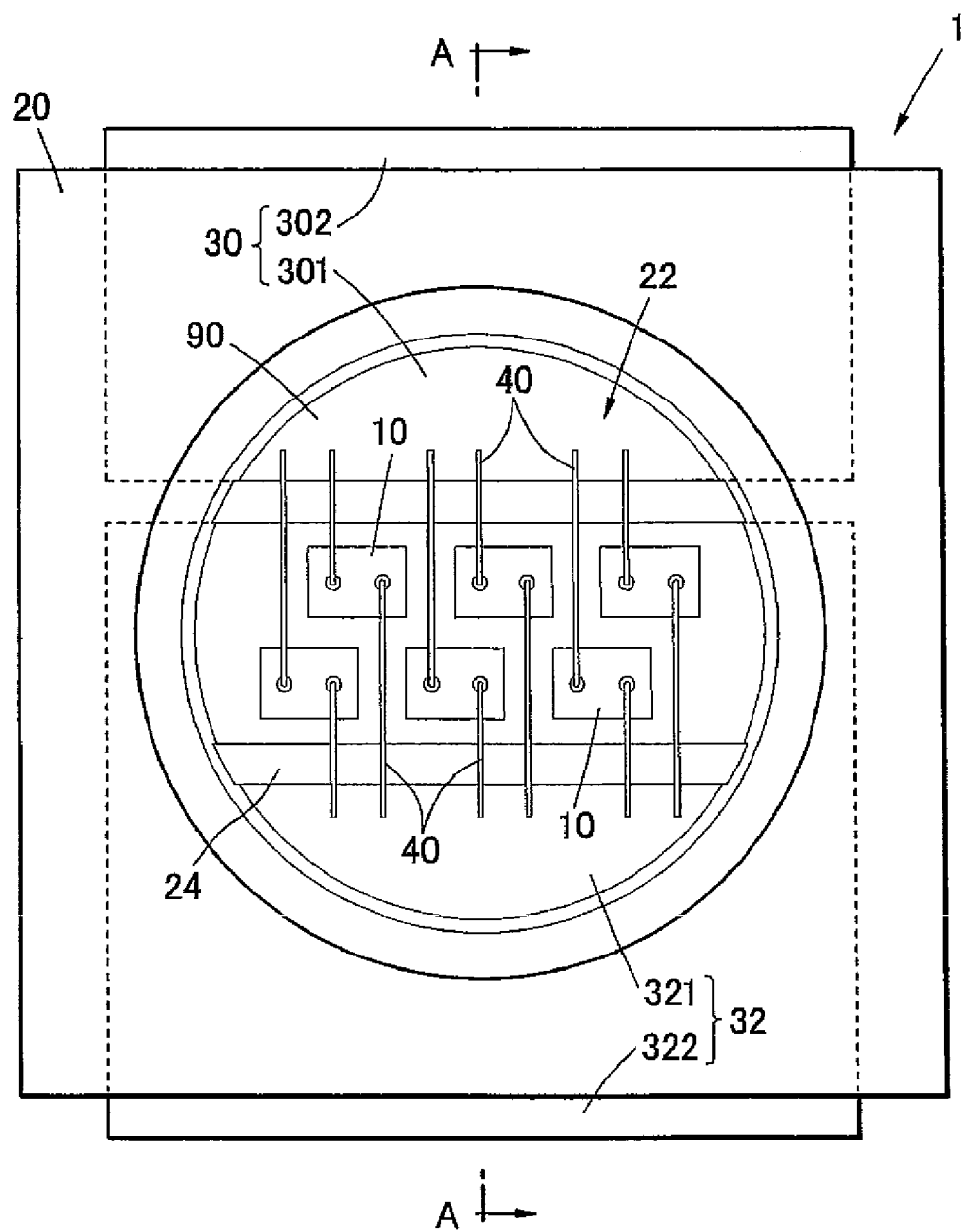
FIG. 1 is a top view of a light emitting device according to Embodiment 1.
Figure 2:
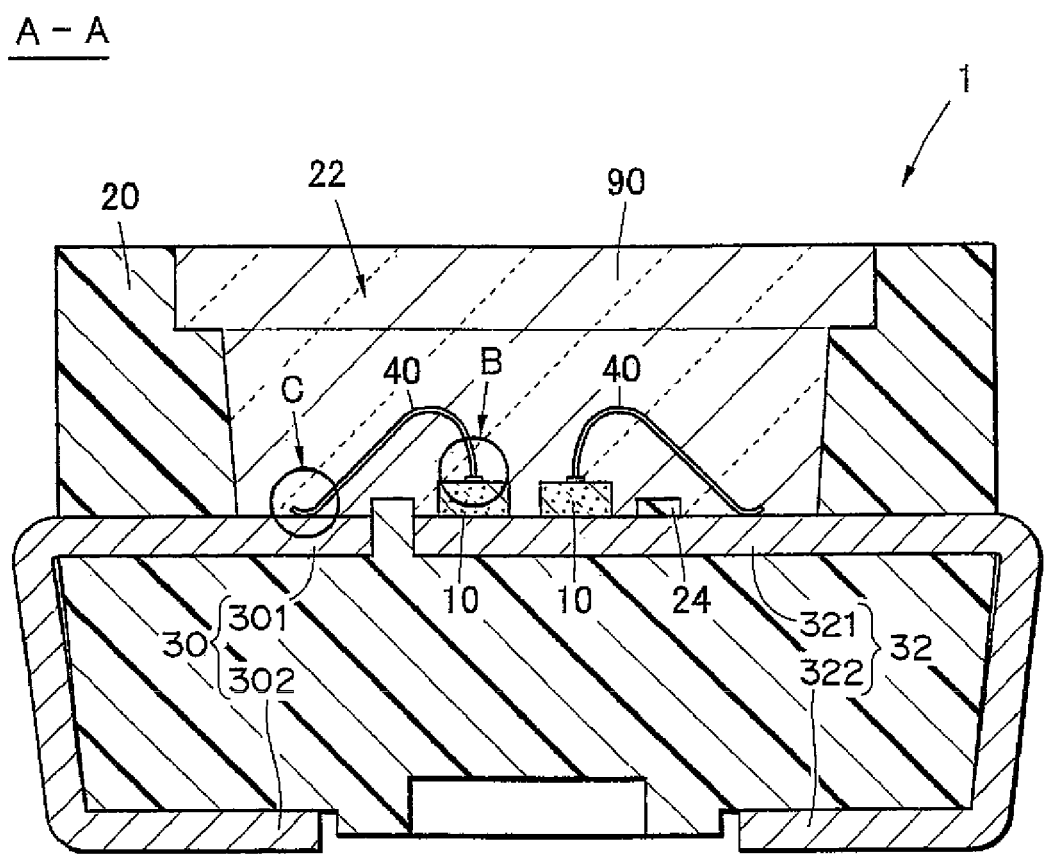
FIG. 2 is a cross-sectional view of a light emitting device according to Embodiment 1 taken along line A-A of FIG. 1.

FIG. 1 and FIG. 2 show a light emitting device 1 according to the present embodiment, provided with a package using a lead frame as a base. Light emitting elements 10 are mounted face-up within a recess 22 of a package 20. Further, a pair of lead electrodes (first electrode 30, second electrode 32) are placed penetrating the package 20 as electrically conductive members. An end portion of each lead electrode 30, 32 is exposed in the recess 22 to form an inner conductive portion (lead electrode) 301, 321, respectively. The other end of each lead electrode 30, 32 penetrates through the package 20 to form an external conductive portion (external terminal) 302, 322, respectively. A pair of electrodes (not shown) disposed on each of the light emitting elements 10 are electrically connected to a pair of lead terminals (first lead terminal 301, second lead terminal 322) via conductive wires 40 respectively.

Figure 3:
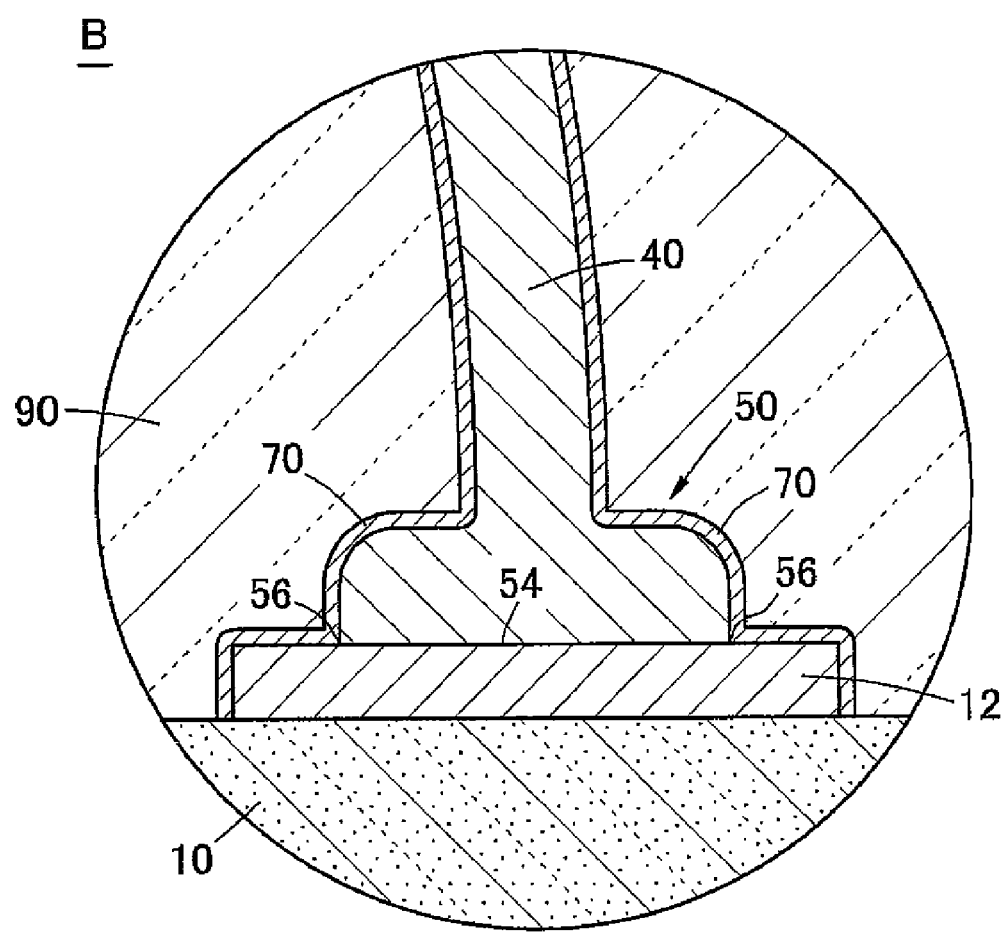
FIG. 3 is a partially enlarged cross sectional view of an area encircled by B in FIG. 2.
Figure 4:
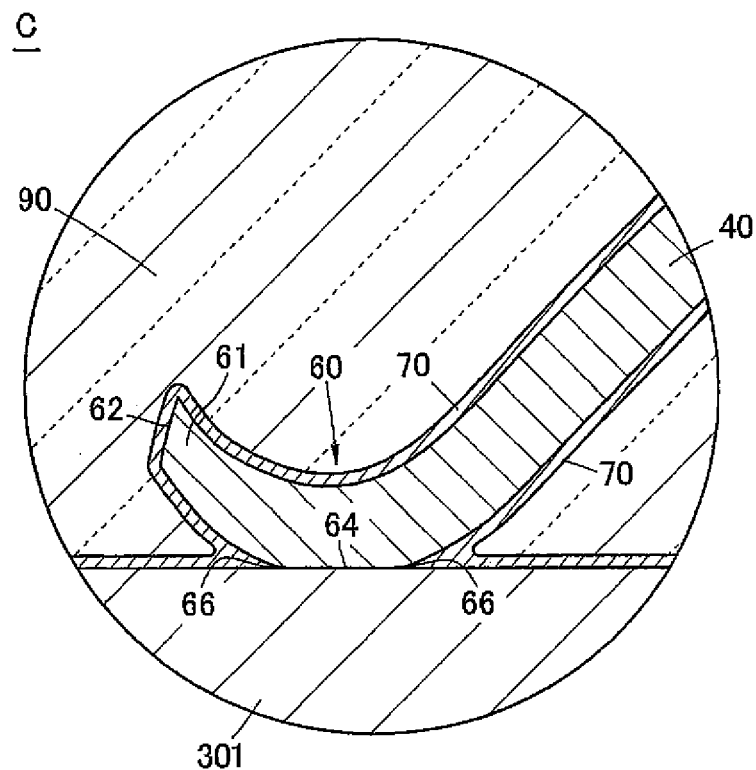
FIG. 4 is a partially enlarged cross sectional view of an area encircled by C in FIG. 2.

FIG. 3 is a partially enlarged cross sectional view of a bonding portion (encircled area B in FIG. 2) between an electrode 12 of the light emitting element 10 and a conductive wire 40. FIG. 4 is a partially enlarged cross sectional view of a bonding portion (encircled area C in FIG. 2) between the first lead terminal 301 and a conductive wire 40.

The bonding portion shown in FIG. 3 is a first bond 50 of ball bonding. In the present embodiment, the surface of the first bond 50 and the electrode 12 of the light emitting element 10 are covered with a metal film 70, and that differs from a first bond 150 and an electrode 112 of the light emitting element 110 using a conventional composite wire 140. As described above, absorption of light by the conductive wire 40 is suppressed in the light emitting device 1 according to the present invention.

An end portion of the conductive wire 40 is melt into a ball shape and pressed to bond to the electrode 12, so that the first bond 50 has a shape of crushed ball. The surface of the first bond 50 is covered with the metal film 70.

In the light emitting device 1 of the present invention, reflectivity of the metal film 70, particularly the reflectivity of the metal film 70 at the emission peak wavelength of the light emitting element 10 is higher than the reflectivity of the conductive wire 40. With this arrangement, light reached the first bond 50 is reflected by the metal film 70 and the reflected light can be extracted out of the light emitting device, so that the light extraction efficiency of the light emitting device can be improved. That is, in the light emitting device 1 of the present invention, absorption of light at the first bond 50 can be reduced and the light that has not been absorbed can be reflected and extracted from the light emitting device 1. With the above-described two functions, the light extraction efficiency of the light emitting device 1 can be improved. In addition, it is preferable when the metal film 70 also covers the surface of the conductive wire 40, the light extraction efficiency of the light emitting device 1 can be further improved. It is further preferable when the metal film 70 continuously covers from the surface of the electrode 12 of the light emitting element 10 through the outer border 56 of the bonded surface 54 of the second bond 50 to the surface of the conductive wire 40. In a case where the electrode 12 of the light emitting element 10 absorbs more light from the light emitting element 10 than that absorbed by the metal film 70, absorption of light by the electrode 12 can be reduced with the continuous metal film 70, and the light extraction efficiency of the light emitting device 1 can be further improved. In addition, the continuous metal film 70 covers the outer edge 56 of the bonded surface between the first bond 50 and the electrode 12, so that bond strength at the bonded surface 54 is strengthened. Thus, detachment of the conductive wire 40 tends to be prevented.

The bonding portion shown in FIG. 4 is a second bond 60 of ball bonding. In the present embodiment, the end surface 62 and the surface of the second bond 60 are covered with the metal film 70 and the conductive wire is not exposed and that differs from the second bond 160 using a conventional composite wire. As described above, the entire bonding portion including the exposed end surface 62 is covered with the metal film 70 in the second bond 60. Therefore, absorption of light by the conductive wire 40 can be suppressed and the light can be reflected to be extracted from the light emitting device 1.

Predetermined position of the continuous conductive wire 40 is thermally pressed to the first lead terminal 301 and then the conductive wire 40 is cut near the joint portion which is also distal to the first bond 50 to form the second bond 60. Therefore, unlike the first bond 50, the conductive wire 40 of the second bond 60 is pressed down and deformed. Moreover, the end portion 61 of the conductive wire 40 protrudes from the second bond 60 to form the end surface 62.

In the light emitting device 1 of the present invention, reflectivity of the metal film 70 at the emission peak wavelength of the light emitting element 10 is higher than the reflectivity of the conductive wire 40. With this arrangement, light reached the second bond 60 is reflected by the metal film 70 and the reflected light can be extracted out of the light emitting device, so that the light extraction efficiency of the light emitting device can be improved. That is, in the light emitting device 1 of the present invention, absorption of light at the second bond 60 can be reduced and the light that has not been absorbed can be reflected and extracted from the light emitting device 1. With the above-described two functions, the light extraction efficiency of the light emitting device 1 can be improved in addition, it is preferable when the metal film 70 also covers the surface of the conductive wire 40, the light extraction efficiency of the light emitting device 1 can be further improved. It is further preferable when the metal film 70 continuously covers from the surface of the electrode 12 of the light emitting element 10 through the outer border 66 of the bonded surface 64 of the second bond 50 to the surface of the conductive wire 40. The continuous metal film 70 covers the outer edge 66 of the bonded surface 64 between the second bond 60 and the first lead terminal 301, so that bond strength at the bonded surface 54 is strengthened. Thus, detachment of the conductive wire 40 tends to be prevented.

Figure 15:
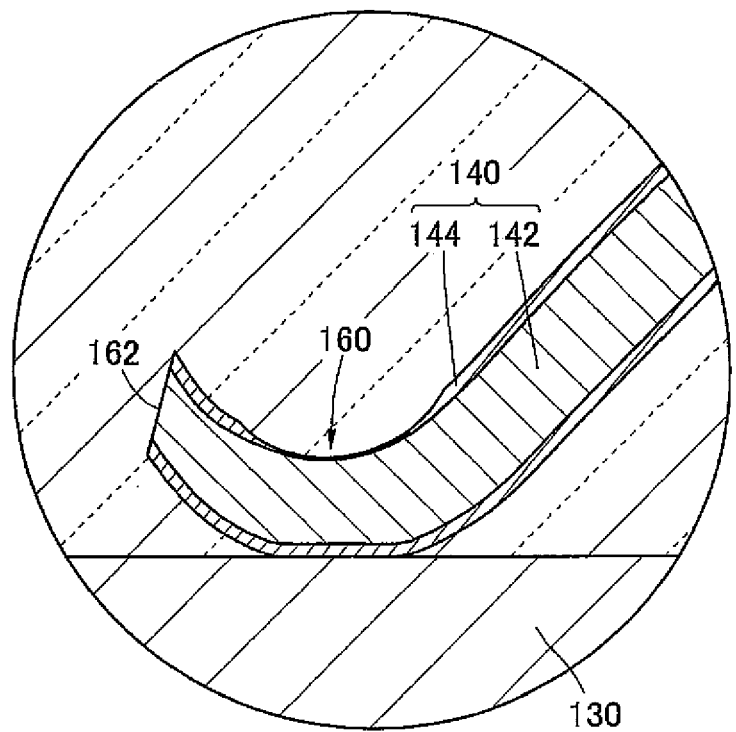
FIG. 15 is a partially enlarged view illustrating a wire bonding structure of a conventional light emitting device.

As described above, in the light emitting device 1 of the present invention, the end surface 62 of the conductive wire 40 is covered with the metal film 70 so that absorption of light at the end surface 62 can be reduced and the light-emitting efficiency of the light emitting device 1 can be improved. That is, absorption of light from the light emitting element that occurs at the exposed end surface 162 of the composite wire 140 in the conventional light emitting devices such as shown in FIG. 15 can be eliminated.

As shown in FIG. 3 and FIG. 4, in a case where the metal film 70 is formed neither on the bonded surface 54 between the first bond 50 and the electrode 12 nor on the bonded surface 64 between the conductive wire 40 and the first lead terminal 301, the bond strength of the first bond 50 and the second bond 60 can be increased to substantially the same strength as that in usual wire bonding.

In a case where the light emitting element 10 used in the light emitting device 1 has a emission wavelength in a range of 400 nm to 530 nm, improvement in the light extraction efficiency can be significant. This is because a metal (for example Cu and Au) having a high optical absorption rate in a range of 400 nm to 530 nm (bluish violet to green) is usually used as the material of conductive wire 40 and lead electrodes 30, 32, and covering them with the metal film 70 significantly reduce the absorption of light. The improvement in the light extraction efficiency can also be achieved, for example, in a white light emitting device that combines a blue light emitting diode and a yellow fluorescent material.

As described above, the metal material having a high reflectivity for light from the light emitting element 10 is used for the metal film 70. Particularly, a material having the reflectivity of 80% or more is preferable, because sufficient improvement in the light extraction efficiency can be obtained with a commonly-available material. Ag or an Ag alloy is suitable. Ag and an Ag alloy have a high reflectivity over a whole wavelength range of visible light and can be easily applied regardless of the emission color of the light emitting element 10. In addition, Ag and an Ag alloy are advantageous that they are easily-available and the metal film 70 is also easy to form. Ag is suitable in terms of reflectivity and an Ag alloy is suitable in terms of resistance to discoloration due to sulfidation or the like.

In a case where a material (such as Ag) which may discolor from chemical reaction is used for the metal film 70, it is preferable that discoloration of the metal film 70 be prevented by a coating film. With this, a rapid increase in optical absorption due to discoloration of the metal film 70 can be prevented, and a high light extraction efficiency of the light emitting device 1 can be maintained for a long time.

Discoloration of the metal film 70 is mainly due to that ambient air containing such as an organic gas and moisture enter from outside of the package 20 into the recess 22 of the package 20 and contacts the metal film 70. Ambient air enters the recess 22 through a gap between the package 20 and the lead frames 30, 32, through a gap between the package 20 and the sealing resin 90, and/or penetrating through the sealing resin 90. Accordingly, in one of the ways to prevent discoloration, the surface of the metal film 70 is covered with a coating film so that the metal film 70 is isolated from ambient air. In another way, the package 20 and the surface 92 of the sealing resin 90 are covered with a coating film so that ambient air is prevented from entering the recess 22 of the package 20.

Examples of applications of the coating film will be described in detail below with reference to the drawings.

FIG. 5 to FIG. 8 respectively shows an example in which the surface of the metal film (not shown) is covered with the coating film 72. According to these examples, prevention of not only discoloration of the metal film 70 but also occurrence of electromigration in the metal film 70 can be expected. Even in a case where the metal film 70 is made of a metal material (such as Ag and an Ag alloy) which easily causes electromigration to occur, reduction of failure of the light emitting device 1 due to electrical short circuit can be expected.

Figure 5:
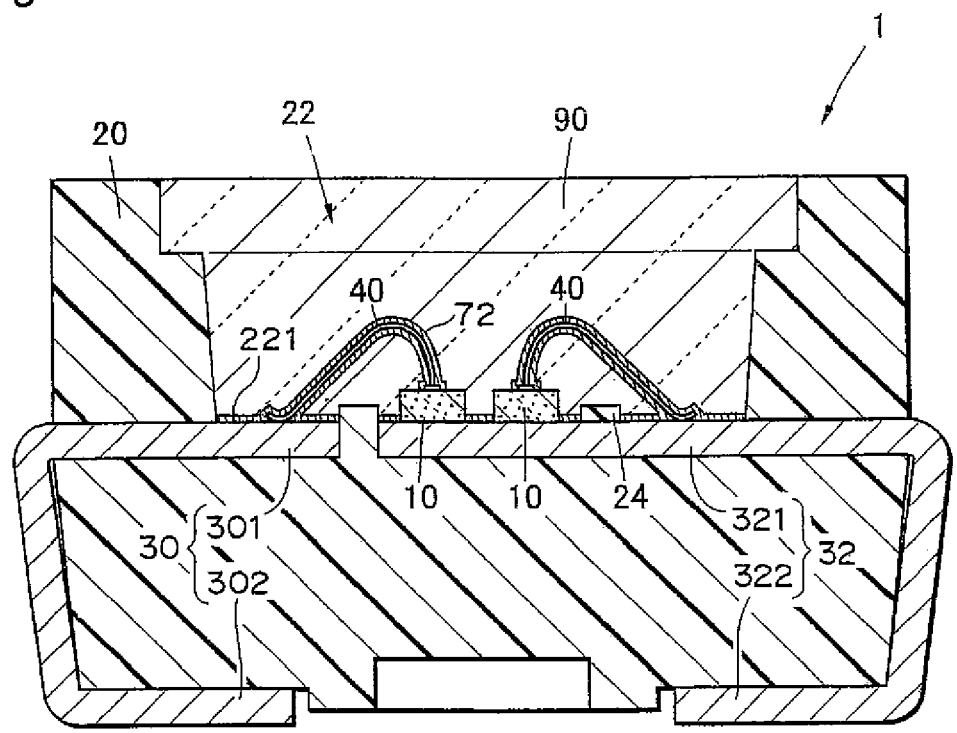
FIG. 5 is a cross sectional view illustrating an application of a coating film to a light emitting device according to Example 1.

In the light emitting device 1 shown in FIG. 5, the coating film 72 directly covers the metal film (not shown). With this arrangement, the metal film 70 can be isolated from ambient air. The light emitting elements 10 of the light emitting device 1 are not covered with the coating film 72 so that the emission from the light emitting elements 10 is not affected (absorption, reflection etc.) by the coating film 72, and is therefore advantageous in terms of maintaining the light extraction efficiency.

Figure 6:
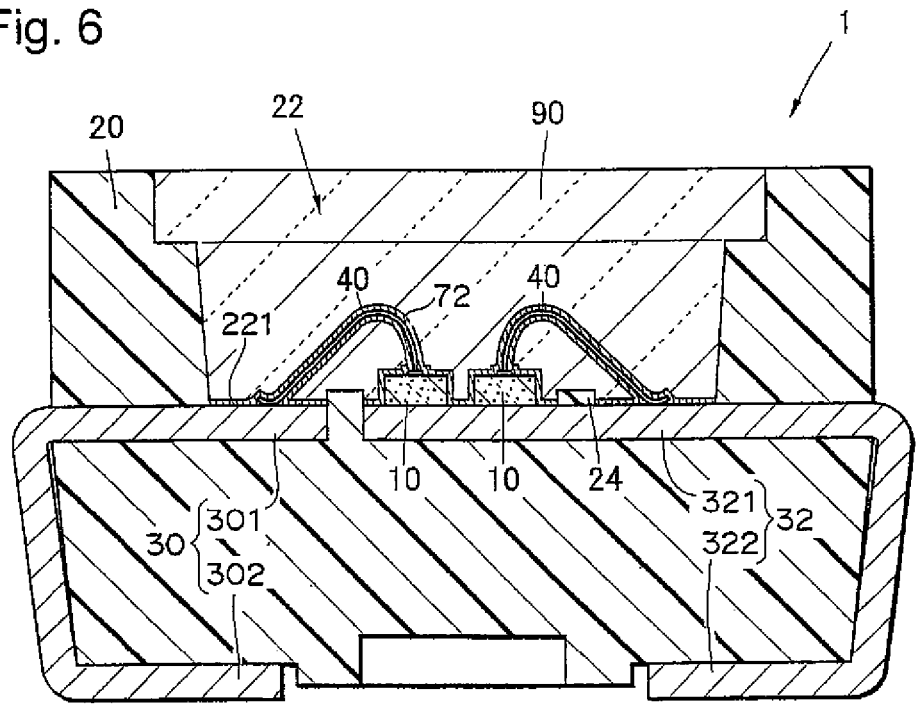
FIG. 6 is a cross sectional view illustrating an application of a coating film to a light emitting device according to Example 1.

The coating film 72 of the light emitting device 1 shown in FIG. 6 also covers the surfaces of the light emitting elements 10. The light emitting device 1 is advantageous in that the light emitting elements 10 can be isolated from ambient air and consequently the light emitting devices 10 are less subjected to deterioration. The coating film 72 is preferably made of a material having a high transmission (for example, 70% or higher) at the emission wavelength of the light emitting elements 10. In FIG. 6, a part of the package 20 exposed at the bottom surface 221 of the recess 22 of the package 20 (that is, exposed from between the lead terminals 301, 321) and the bleed-out-preventing wall 24 are not covered with the coating film 72, but the coating film 72 may be applied thereon.

Figure 7:
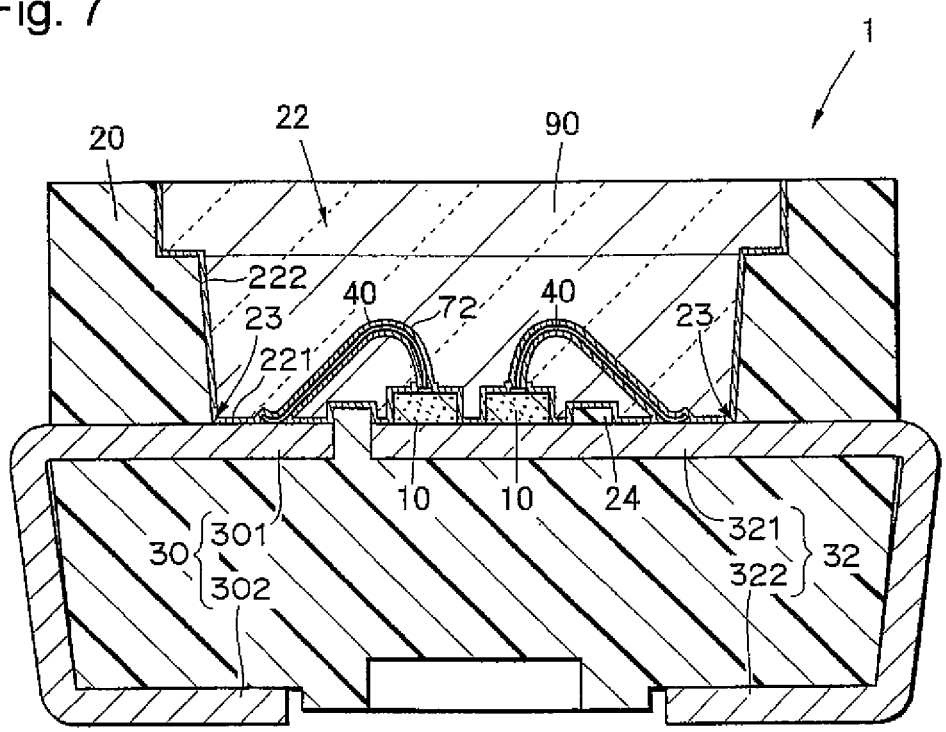
FIG. 7 is a cross sectional view illustrating an application of a coating film to a light emitting device according to Example 1.

The coating film 72 of the light emitting device 1 shown in FIG. 7 further covers the inner surfaces (including the side surface 222) of the recess 22 of the package 20. That is, the coating film 72 extends from the surface of the metal film to cover the inner surface defining the recess 22 and the surfaces of the lead terminals 301, 321. With this arrangement, the boundaries 23 between the side surface 222 defining the recess 22 of the package 20 and the lead terminals 301, 321 are covered with the coating film 72. Accordingly, even if ambient air enters the interface between the package 20 and the lead electrodes 30, 32, it can be prevented from entering the recess 22 of the package 20.

Figure 8:
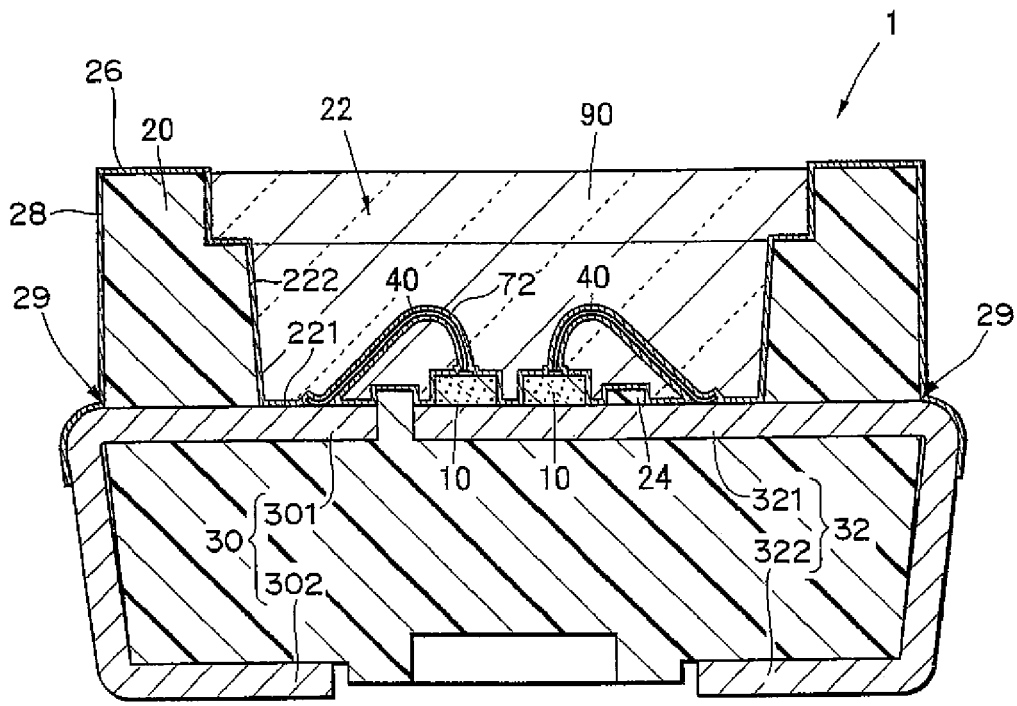
FIG. 8 is a cross sectional view illustrating an application of a coating film to a light emitting device according to Example 1.

The coating film 72 of the light emitting device 1 shown in FIG. 8 further covers the top surface 26 of the package 20, the outer surface 28 of the package 20, and the external terminals 302, 322 exposed outside of the package 20. That is, the coating film 72 extends from the surface of the metal film to cover the outer surface 28 of the package 20 and the surfaces of the external terminals 302, 322. With this arrangement, the boundaries 29 between the outer surface 28 of the package 20 and the external terminals 302, 322 are covered with the coating film 72. Accordingly, ambient air can be prevented from entering the interfaces between the package 20 and the lead electrodes 30, 32 through the boundaries 29.

In FIG. 8, a part of the surfaces of the external terminals 302, 322 are covered with the coating film 72. That is, the rest of the surfaces of the external terminals 302, 322 are not covered with the coating film 72. But, the entire surfaces of the external terminals 302, 322 may be covered with the coating film 72. In this case, the coating film 72 is preferably set to a thickness of 5 μm or less, and more preferably to 3 μm or less, which does not adversely affect mounting of the light emitting device.

Figure 9:
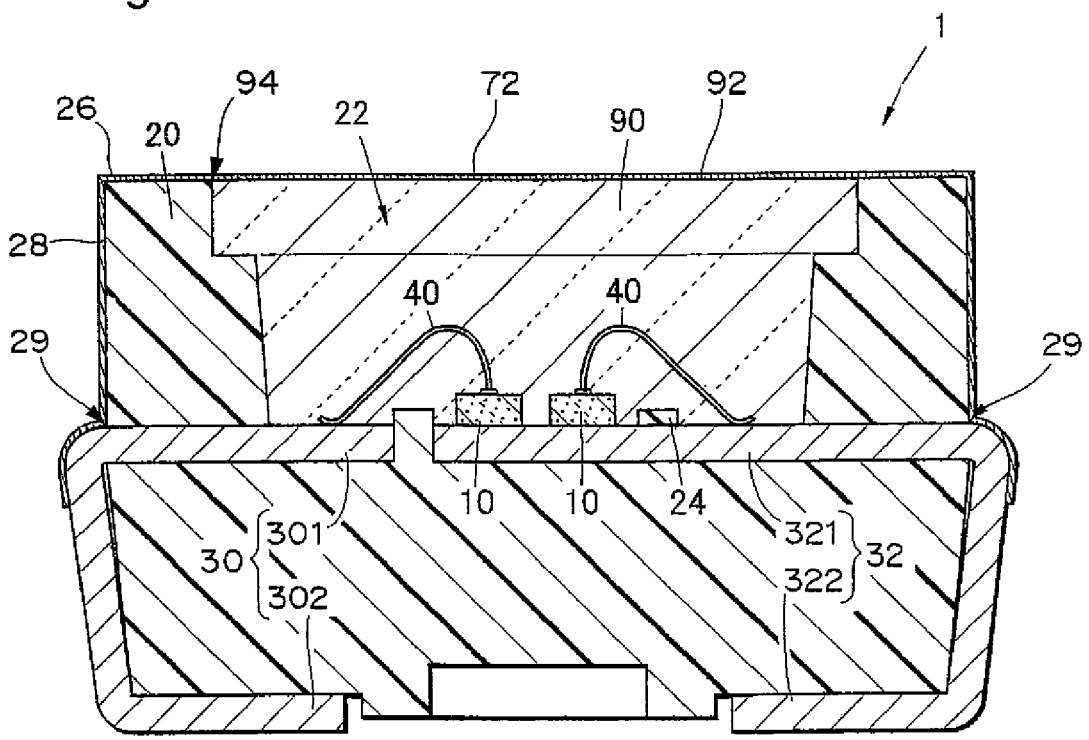
FIG. 9 is a cross sectional view illustrating an application of a coating film to a light emitting device according to Example 1.

FIG. 9 shows an example in which the surface 92 of the sealing resin 90 is covered with the coating film 72. For example, even in a case where a sealing resin (such as a silicone resin) 90 having gas permeability, the metal film 70 (not shown) can be isolated from ambient air. Particularly, as shown in FIG. 9, the coating film 72 preferably continuously covers not only the surface 92 of the sealing resin 90 but also the top surface 26 of the package 20. Accordingly, ambient air can be prevented from entering the interfaces between the sealing resin 90 and the package 20 from the boundary 94. The coating film 72 is preferably made of a material having a high transmission (for example, 70% or higher) at the emission wavelength of the light emitting elements 10.

Further, as in the case shown in FIG. 8, the coating film 72 preferably continuously covers the outer surface 28 of the package 20 and the surfaces of the external terminals 302, 322. Accordingly, ambient air can be prevented from entering the interfaces between the package 20 and the lead electrodes 30, 32 from the boundary 29.

In addition, as in the light emitting device 1 of FIG. 8, the entire surfaces of the external terminals 302, 322 can also be covered with the coating film 72 in the light emitting device 1 of FIG. 9. In this case, the coating film 72 is preferably set to a thickness of 5 μm or less, and more preferably to 3 μm or less, which does not adversely affect mounting of the light emitting device.

Improvement in the light extraction efficiency according to the present invention is more efficient in a construction having a plurality of the light emitting devices 10. This is because when the number of the light emitting elements 10 increases, the total length of the conductive wire 40 that is used increases and suppression of optical absorption obtained by covering the conductive wire 40 can be more effective.

Steps of manufacturing the light emitting device 1 of this embodiment will now be described below.

(1. Formation of Package 20)

Figure 10:
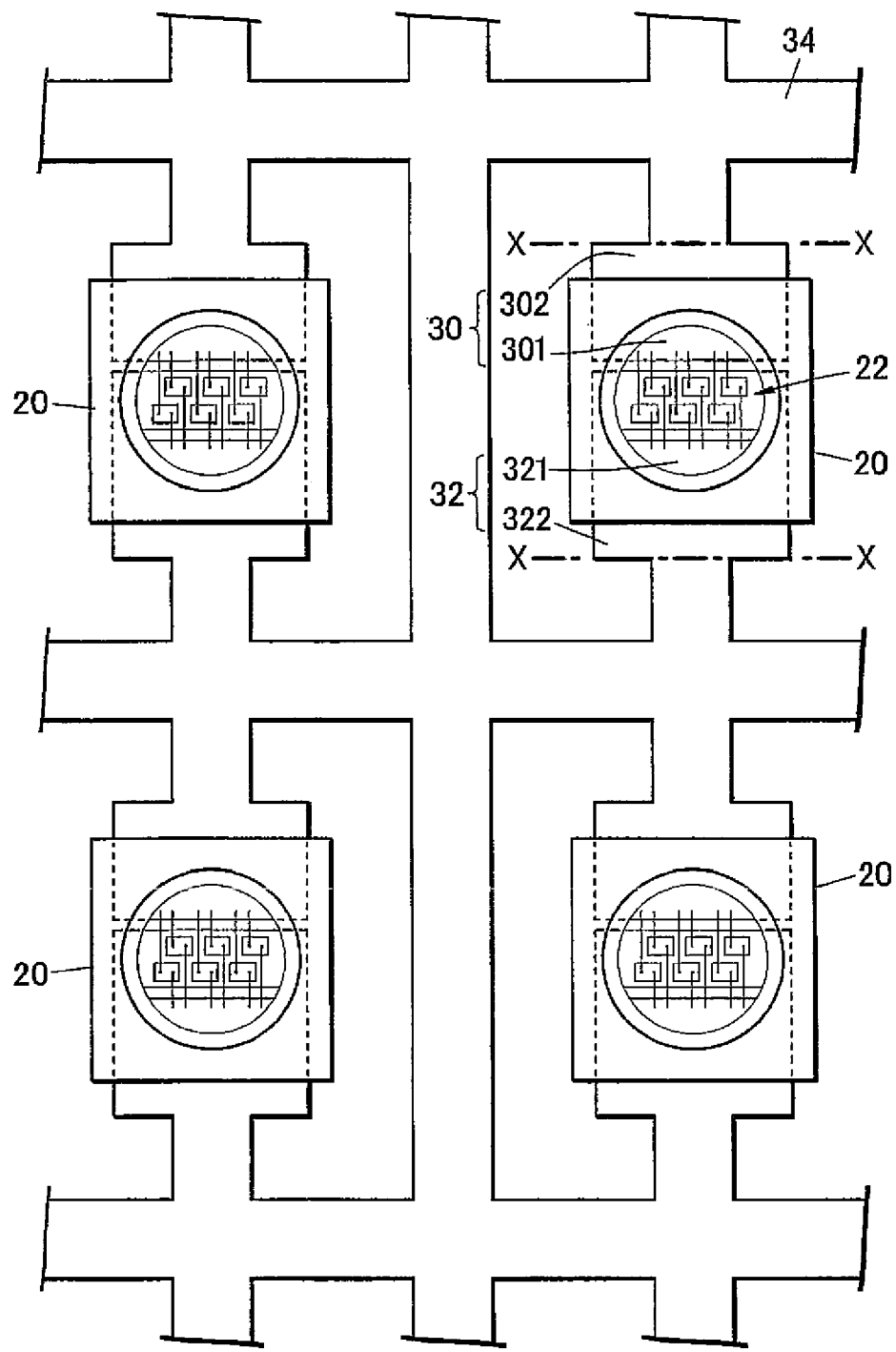
FIG. 10 is a schematic top view, illustrating a manufacturing step of a light emitting device according to Embodiment 1.

As shown in FIG. 10, a plurality of packages 20 are fabricated on the lead frame 34 formed by cutting out a thin metal plate. A plurality of pairs of first lead terminals 301 and second lead terminals 322 are disposed on the lead frame 34. Each of the packages 20 is formed to include a pair of lead terminals 301, 321. In a case where the packages 20 are made of a resin, the lead frame 34 is held between the metal molds for the packages 20 and the packages 20 are formed by way of resin molding such as a mold forming.

(2. Die Bonding Step)

Next, the light emitting elements 10 are die bonded onto the second lead terminals 321 respectively. A suitable die bonding material, for example, a solder material such as Au—Sn, or a silicone adhesive or a modified silicone adhesive is used for die bonding. As shown in FIG. 1, when a bleed-out prevention wall 24 is provided on the second lead terminal 321, a die bonding material having a low viscosity can be prevented from spreading over the second lead terminal 321.

(3. Wire Bonding Step)

The die-bonded light emitting elements 10 are wire-bonded with the respective lead terminals 301, 321 by means of conductive wires 40. A pair of electrodes are disposed on the light emitting side of each of the light emitting elements 10 shown in FIG. 1 and the electrodes and the lead terminals 301, 321 are respectively connected with the conductive wires 40. Forms of wire bonding include ball bonding and wedge bonding. In a ball bonding step, as shown in FIG. 1 to FIG. 4, typically, the first bond 50 is bonded to the electrode 12 of the light emitting device 10 and the second bonds 60 are bonded to the lead terminals 301, 321.

(4. Electroplating Step)

Figure 11:
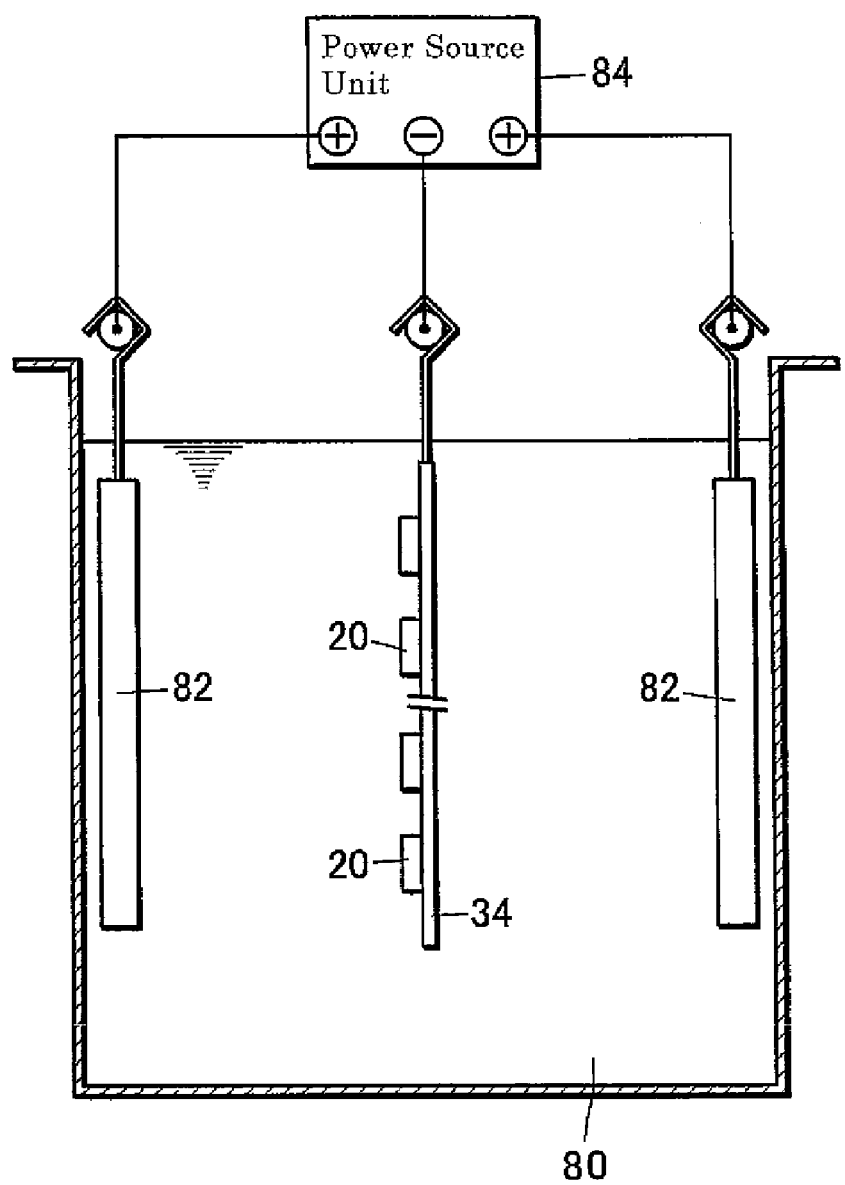
FIG. 11 is a schematic cross sectional view, illustrating an electroplating step of a light emitting device according to Embodiment 1.

As shown in FIG. 11, the lead frame 34 having the light emitting elements 10 mounted thereon is immersed in an electroplating solution 80 together with the packages 20. Voltage is applied from a power source unit 84 between the counter electrodes 82 and the lead frame 34 placed in the electroplating solution 80 to conduct electroplating. All lead frames 30, 32 are electrically connected through the lead frame 34. Therefore, the lead electrodes 30, 32 can be equipotent when voltage is applied between the lead frame 34 and the counter electrodes 82. Further, the conductive wires 40 which are wire-bonded to the lead terminals 301, 321 of the lead electrodes 30, 32 and the electrodes 12 of the light emitting elements 10 to which the conductive wires 40 are connected become equipotent to the lead terminals 301, 321. Therefore, the members provided in a package 20 such as the electrodes 12 of the light emitting element 10, the lead electrodes 30, 32, and the conductive wires 40 (hereinafter collectively referred to as "current-carrying members") can be electroplated at the same time. In a case where a plurality of light emitting elements 10 are provided in a package 20, electroplating can also be applied to all conductive wires 40 and the electrodes 12 of all light emitting elements 10 at the same time. Further, all lead frames 30, 32 connected by the lead frame 34 can be equipotent, so that electroplating can be applied at the same time to all current-carrying members provided in a plurality of packages 20 which are connected by the lead frame 34.

Moreover, as shown in FIG. 10, a plurality of packages 20 are connected with the lead frame 34, so that with one end of the lead frame 34 held as shown in FIG. 11, the plurality of packages 20 can be immersed simultaneously in the electroplating solution 80.

Electroplating will now be described in detail below.

The step applying electroplating the metal films 70 to the current-carrying members includes the steps of (1) activating the surfaces of the current-carrying members with an acid and/or alkaline, (2) preparing an electroplating solution 80 suitable to the desired composition of the metal film 70, (3) immersing the current-carrying members and the counter electrodes 82 in the electroplating solution 80, and (4) electrically connecting the current-carrying members and the counter electrodes 82 through a power supply and applying voltage so that the current-carrying members act as anode and the counter electrodes 82 act as cathode.

Particularly, in step (4), it is preferable to sequentially perform a strike plating in which the current is applied for a short time and an electroplating in which the current is applied until the metal film 70 obtains a predetermined film thickness. Dense metal particles having good adhesion can be deposited by strike plating, so that the metal film 70 which is homogeneous and resistant to detachment can be obtained.

In the present invention, the metal film 70 is disposed by way of electroplating that allows selective deposition of the metal film 70 onto the current-carrying materials. That is, electric potential does not occur in the light emitting elements 10 in the electroplating with the arrangement as shown in FIG. 11, so that the metal films 70 are not deposited on the surfaces of the light emitting elements 10, respectively. With this, the total surface of the current-carrying materials of each package can easily be covered with the continuous metal film 70 and thus most suitable for forming the metal film 70 of the invention.

Plating conditions using the electroplating solution 80 which is suitable to form the metal film 70 made of Ag and an Ag alloy will be illustrated below.

(Ag metal film) Prepare an Ag electroplating bath 80 and carry out electroplating.

(Ag—Au metal film) Prepare an Ag—Au alloy electroplating bath 80 for a co-deposition ratio of Ag:Au=99.9 to 60:0.1 to 40 by weight, and carry out electroplating.

(Ag—In metal film) Prepare an Ag—In alloy electroplating bath 80 for a co-deposition ratio of Ag:In=99.9 to 95:0.1 to 5 by weight, and carry out electroplating.

(Ag—Pd metal film) Prepare an Ag—Pd alloy electroplating bath 80 for a co-deposition ratio of Ag:Pd=99.9 to 89:0.1 to 11 by weight, and carry out electroplating.

(Ag—Pt metal film) Prepare an Ag—Pt alloy electroplating bath 80 for a co-deposition ratio of Ag:Pt=99.9 to 89:0.1 to 11 by weight, and carry out electroplating.

(5. Sealing Step)

After depositing the metal films 70 by way of electroplating, the recesses 22 of the packages 20 are sealed with a sealing resin 90. The sealing member 90 is filled in the recesses 22 by using a known technology such as potting, printing, transfer molding, then cured. A light diffusing material, a fluorescent material or the like can be contained in the sealing member 90.

(6. Cut-Forming Step)

Cut the lead frame 34 along line X-X in FIG. 11 to divide into discrete light emitting devices 1 (cutting step). The portion of the external terminals 302, 322 protruding outwardly from the packages 20 are bent along the external shape of the packages 20 as shown in FIG. 2 (forming step). Thus, the light emitting device 1 according to the present invention can be obtained.

Next, each constructional member will be described in detail below.

(Light Emitting Element 10)

For the light emitting element 10, a semiconductor light emitting element can be used, and an element such as a so-called light emitting diode or laser diode is preferable. Examples of such a semiconductor light emitting element include a stacked layer structure, which includes an active layer, is formed on a substrate, the stacked layer is formed by using various semiconductors such as a nitride semiconductor such as InN, AlN, CaN, InGaN, AlGaN, or InGaAlN, a Group III-V compound semiconductor, and a II-VI compound semiconductor. Examples of the substrate include an insulating substrate such as sapphire ($Al_2O_3$) having a C-plane, A-plane, or R-plane as a principle plane and spinal ($MgAl_{12}O_4$), SiC (including 6H, 4H, and 3C), silicon, ZnS, ZnO, GaAs, diamond; an oxide substrate such as $LiNbO_3$ and $NdGaO_3$, and a nitride semiconductor substrate (GaN, AlN and the like). The semiconductor structure may be a homo-structure, a hetero-structure, or a double-hetero-structure having a MIS junction, a PIN junction, or a PN junction. Also, the active layer can be of a single well structure or a multiple well structure, formed as a thin layer in which a quantum effect can occur. A donor dopant such as Si or Ge and/or an acceptor dopant such as Zn or Mg may be doped into the active layer. The emission wavelength of the light emitting element thus obtained can be varied from ultraviolet region to infrared region by changing the material of the semiconductor, the mixed crystal ratio, the content of In in InGaN active layer, the kind of dopant that is doped into the active layer.

The shape of the light emitting elements 10 is not specifically limited and for example, a circular, an oval, a polygon, or a similar shape thereof, can be employed.

A single or a plurality of light emitting elements 10 may be provided in a light emitting device 1. In the present embodiment, the light emitting device 1 is provided with six light emitting elements 10 which are arranged such that three light emitting elements are arranged in the longitudinal direction and two light emitting elements are arranged in the lateral direction. In a case where ten light emitting elements 10 are arranged, the rows of light emitting elements 10 are preferably arranged in a staggered manner so that the conductive wires 40 connected to the light emitting elements 10 are not laid over the light emitting surface of other light emitting elements 10.

(Current-Carrying Member)

The current-carrying member in the present invention includes an electrode of the light emitting element 10, a semiconductor element (for example, Zener diode, light receiving element, and the like), lead electrodes 30, 32, or the like, and at least one member thereof is provided to the light emitting device. In the present embodiment, the electrode 12 of the light emitting element 10, the first lead electrode 30, and the second lead electrode 32 are provided.

(First Lead Electrode 30, Second Lead Electrode 32)

The first lead electrode 30, the second lead electrode 32 can be formed with a good electric conductor such as iron, phosphor bronze, or a copper alloy. In addition, in order to improve the reflectivity of the light from the light emitting element 10, metal plating using silver, aluminum, copper, gold, or the like can be performed on the surfaces of the lead electrodes 30, 32 prior to mounting the light emitting element 10. Moreover, in order to improve the reflectivity of the surfaces of the lead electrodes 30, 32, the surfaces are preferably smooth.

Further, the surface area of the first lead electrode 30 and the second lead electrode 32 (the surface area of the first lead terminal 301 and the second lead terminal 321) may either be substantially the same or differ. For example, as shown in FIG. 1, the second lead terminal 321 may be made wider than the first lead terminal 301 and the light emitting elements 10 are die-bonded to the second lead terminal 321. If the die bonding material spreads toward entire area of the second lead electrode 321 at the time of die-bonding the light emitting elements 10 onto the second lead terminal 321, the connection between the second lead terminal 321 and the conductive wires 40 may be impeded in subsequent die-bonding. Therefore, a bleed-out-preventing wall 24 (see FIG. 1 and FIG. 2) is preferably provided on the surface of the second lead terminal 321. In a case where the bleed-out-preventing wall 24 is made of the same material as that of the package 20, the package 20 and the bleed-out-preventing wall 24 can be formed simultaneously.

(Conductive Wire 40)

Conductive wires 40 can be made of any metal materials that is suitable for wire bonding, but a metal material which includes at least one selected from the group consisting of Au, Cu, Al, W, and stainless steel is preferable to obtain the light emitting device 1 having high wire bonding strength and high reliability. Particularly, Au or an Au alloy is suitable for the conductive wire 40, because it is a metal material having good ohmic characteristics and mechanical connectivity (bonding property) with the electrode 12 of the light emitting element 30, and has good electric conductivity and good thermal conductivity.

(Package 20)

The package 20 may be made of any materials capable of protecting the light emitting element 10 etc. Among them, an electrically insulating light blocking material such as ceramic and a milky white resin is preferable. As the resin material, a thermoplastic resin such as aromatic polyamide resin and a thermosetting resin such as epoxy resin can be used, and the package can be formed by using a known method (for example, an injection molding using thermoplastic resin and a transfer molding using thermosetting resin).

Other than a type in which a lead frame is used as its base (such as a surface-mounted type as shown in FIG. 1 and FIG. 2 and a shell-type), a ceramic substrate having an electrode wired thereon, and a glass-epoxy substrate type or the like can be used for the package 20.

(Coating Film 72)

An inorganic coating and an organic coating can be used for the coating film 72. A material having high light transmission such as $SiO_2$, $Al_2O_3$, ZnO, silicate glass, and glass is preferable for inorganic coating. A material such as acrylic resin, fluorine resin, silicone resin, modified silicone resin, epoxy resin, and paraxylene resin and having properties of low optical absorption, high thermostability and high light stability is preferable for organic coating. The coating film can be applied to a desired position by coating, deposition, dipping, spraying, or the like.

Variation

Figure 12:
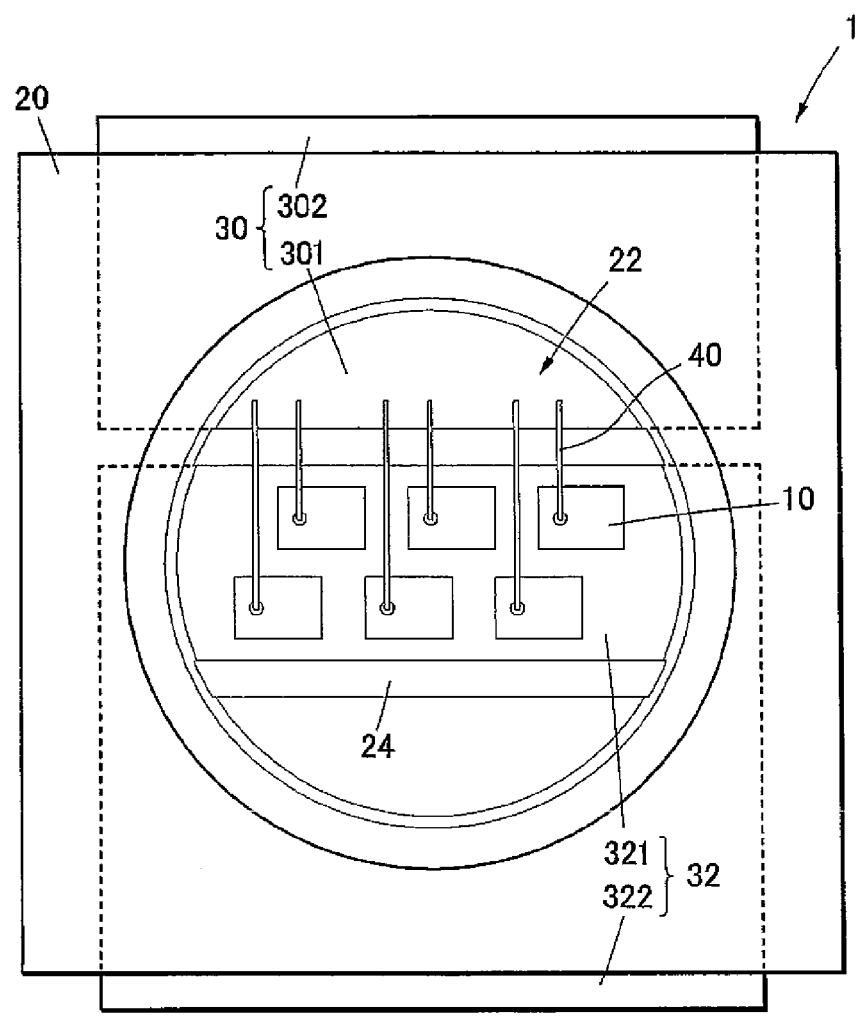
FIG. 12 is a top view, showing a variant example of a light emitting device according to Embodiment 1.

A variation of the present embodiment is shown in FIG. 12. The light emitting device 1 differs from that of the Embodiment 1 in that by using the light emitting elements 10 which allow establishing electric connection from the mounting surface side, the light emitting elements 10 and the second lead terminal 321 are electrically connected via a conductive die bonding material (Ag paste or the like) and the number of the conductive wire 40 connected to each light emitting element 10 is reduced to one.

The number of the conductive wire 40, the number of wire bonding operations, and the amount of the conductive wires used can be reduced by half in the light emitting device 1 of FIG. 12 compared to those in the light emitting device 1 of FIG. 1. Accordingly, even in a conventional light emitting device which lacks the metal film 70, absorption of light by the conductive wire 40 or the like has been relatively small. However, in a case where the conductive wires 40 and the lead terminals 301, 321 are covered with the metal film 70 as in the present invention, absorption of light by the conductive wires 40 will further be reduced, so that light extraction efficiency can be improved.

Embodiment 2

Figure 13:
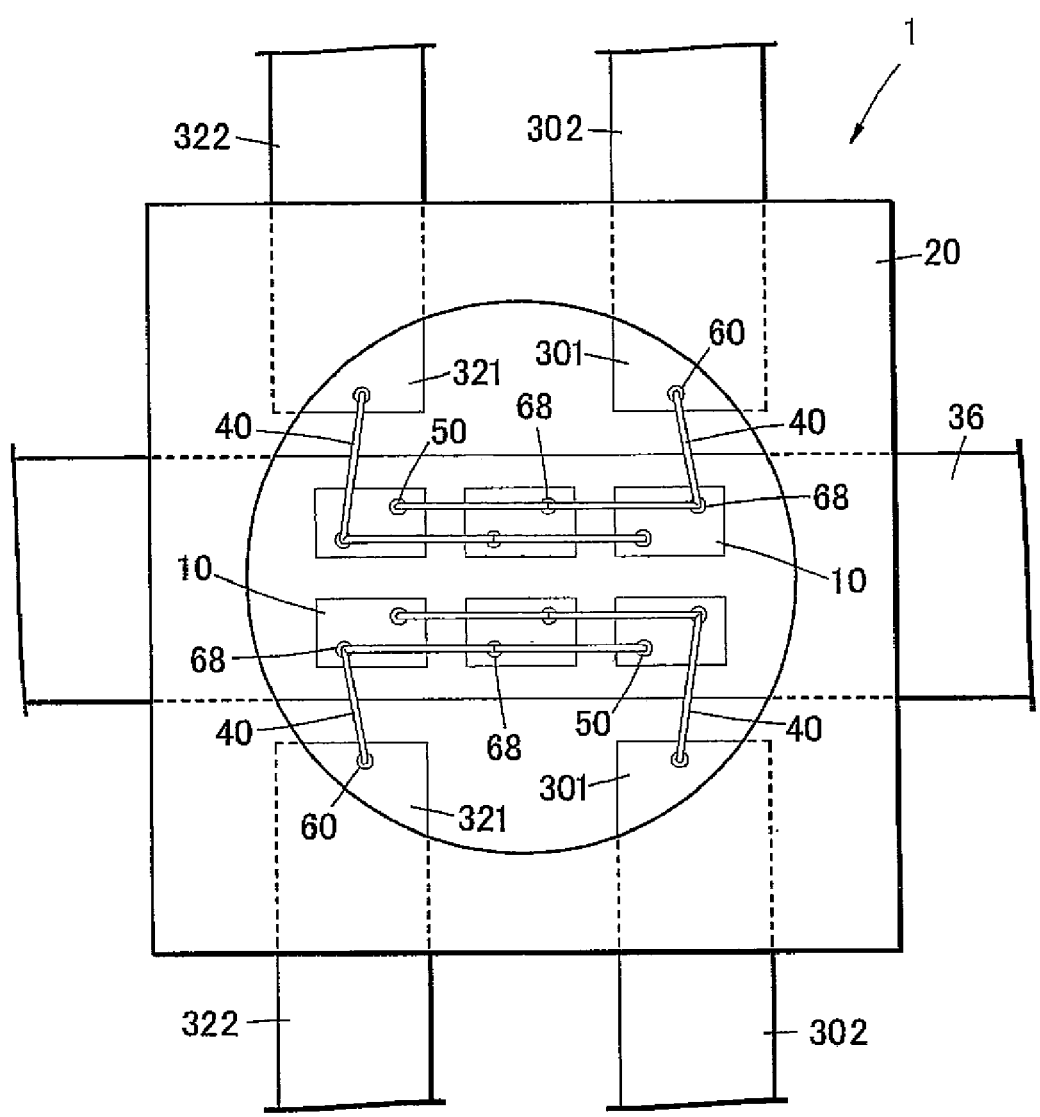
FIG. 13 is a top view of a light emitting device according to Embodiment 2.

The light emitting device 1 shown in FIG. 13 is of a type which includes a package that has a lead frame as its base, as in Embodiment 1. Arrangement of the light emitting elements 10, wiring of the conductive wires 40, and shapes of the first lead electrodes 30 and the second lead electrode 32 are different from that in Embodiment 1. Further, in the present embodiment, a mounting portion 36 which is different from the lead electrode is provided to mount the light emitting elements 10.

In the present embodiment, as shown in FIG. 13, adjacent light emitting elements 10 are connected with the conductive wires 40 so that a plurality of the light emitting elements 10 are electrically connected in series. In this wiring, the conductive wire 40 is thermally compressed to each of the light emitting elements 10 between the first bond 50 and the second bond 60. In the present specification, such a thermally compressed portion is referred to as "stitch bond 68" and the wiring type of the conductive wires 40 using stitch bonds 68 is referred to as "stitch wiring".

A stitch wiring as shown in FIG. 13 requires a shorter length of the conductive wire per element compared with the wiring as shown in FIG. 1 (in the present specification, referred to as "triangular loop wiring"), so that the material cost can be reduced, and also requires a fewer number of wire bonding operations (including stitch bonds 68) per element, so that the manufacturing time can be reduced.

In a stitch wiring, the length of the conductive wire 40 placed over the light emitting surface of the light emitting elements 10 is longer than that in a triangular loop wiring. Therefore, when the conductive wires 40 are covered with the metal film 70, a high effect on suppression of absorption of light can be obtained, so that the light extraction efficiency of the light emitting device 1 can be improved significantly.

In addition, in the present embodiment, a mounting portion 36 other than the lead electrodes 30, 32 is provided to mount the light emitting elements 10. The mounting portion 36 can be obtained through the steps that the mounting portion is formed on the lead frame 34 together with the first lead electrode 30 and the second lead electrode 32 in the step "1. Formation of Package 20", incorporated in the package 20 during its formation, and separated from the lead frame 34 in "6. Cut-Forming Step" in the steps of manufacturing described in Embodiment 1.

Examples

A plurality of samples with modified structures are formed according to the light emitting device 1 shown in FIG. 1 and FIG. 13, and a lighting test is performed.

<A. Preparation of Samples for Measurement>

(1. Formation of Package 20)

As measurement samples, packages of a lead frame type and a substrate type are formed. In case of packages of lead frame type, a lead frame made of a copper-alloy is used, and in case of the samples indicated as Ag in "Covering material of lead frame", Ag film is disposed on the surface of the lead frame. A thermoplastic resin (polyphthalamide) is used for the package material and the packages are made by injection molding.

In case of packages of substrate type, a ceramics substrate of $Al_2O_3$ or a glass epoxy substrate provided with electrode wiring is used.

(2. Die Bonding Step)

A light emitting element 10 is die-bonded onto each package by way of resin bonding using a silicone resin binding material, a modified silicone binding material, an epoxy resin bonding material, or the like, or by way of metal bonding using a solder material such as Au—Sn.

(3. Wire Bonding Step)

The light emitting elements 10 and the lead terminals 301, are electrically connected respectively by using a gold wire of 25 μm in diameter.

(4. Electroplating Step)

Electroplating step is performed in sequence of pretreatment, (water rinsing), strike plating, (water rinsing), plating, (water rinsing), water rinsing, and drying.

(Pretreatment)

In pretreatment, surface-associated contaminants (dirt, oil, sweat fingerprints, organic materials, metallic power, or the like), surface-associated corroded products (oxides, sulfides, passive films, or the like), and surface adsorbates (adsorbed organic compounds, adsorbed moisture, adsorbed gas components, or the like) are removed from the exposed surfaces of the current-carrying members such as the lead electrodes 30, 32 to activate the exposed surfaces. Potassium cyanide aqueous solution is used as a pretreatment solution and the lead frame 34 is immersed the pretreatment solution. During the treatment, the pretreatment solution is agitated with a stirring apparatus. After the treatment, the lead frame 34 is washed in running pure water.

(Strike Plating)

In strike plating, an Ag strike plating bath is prepared and electroplating is carried out. During energization, the plating solution is agitated with a stirring apparatus. After the plating, the lead frame 34 is washed in running pure water.

(Plating)

Plating is performed by using a plating solution prepared for forming a desired alloy film or an alloy film of desired co-deposition ratio. During energization, the plating solution is agitated with a stirring apparatus and the metal film 70 is formed with a thickness of 0.1 to 10.0 μm. After the plating is complete, the lead frame 34 is washed in running pure water.

(Water Rinsing, Drying)

After the plating is completed, the lead frame 34 is washed in running pure water. Then, water droplets are removed by using an air blower so as to dry the lead frame 34.

(5. Sealing Step)

A sealing member of a thermosetting resin is dropped onto the packaged. The thermosetting resin containing 30 parts by weight of a YAG fluorescent material and 5 parts by weight of silicon oxide as a light diffusing agent with respect to 100 parts by weight of a silicone resin is used, and cured at 150° C. for 5 hours.

(6. Cut-Forming Step)

The packages are cut off from the lead frame to obtain separate light emitting devices.

<B. Preparation Conditions of Samples for Measurement>

In the present example, 8 items are set as variable conditions in preparation of the samples for measurement: (1) Covering material of lead terminal, (2) Material of conductive wire, (3) Material of metal film, (4) Number of mounted light emitting elements, (5) Number of wires, (6) Wiring type of conductive wire, (7) Surface treatment, and (8) Package type. These preparation conditions will be briefly described below.

The term (1) "covering material of lead terminal" refers to the covering material if the lead terminals 301, 321 are covered with a coating material prior to mounting the light emitting element 10. As the covering material, a metal material having a high reflectivity to the emission from the light emitting elements 10 is preferable.

The term (2) "materials of conductive wire" refers to the material used for the conductive wires 40.

The term (3) "material of metal film" refers to the metal material constructing the metal film 70 of the present invention. The relative proportions of the "material of metal film" used in the present example and the reflectivity to light having wavelength of 450 nm are shown in Table 1.

The term (4) "number of mounted light emitting elements" refers to the number of the light emitting elements 10 mounted on a light emitting device 1. A higher output of the light emitting device 1 can be obtained by increasing the "number of mounted light emitting elements".

The term (5) "number of wires" refers to the number of the conductive wires 40 connected to a light emitting element 10. Herein, the term "light emitting device 1 having one wire" refers to a light emitting device 1 such as shown in FIG. 12, and the term "light emitting device 1 having two wires" refers to a light emitting device 1 such as shown in FIG. 1 or FIG. 13.

The term (6) "wiring type of conductive wires" refers to a wiring type of the conductive wires 40 connected to the light emitting elements 10. In the present example, a triangular loop wiring such as shown in FIG. 1 or a stitch wiring such as shown in FIG. 13 is used.

The term (7) "surface treatment" refers to a processing the surface of the metal film 70 with, for example, a coating agent or the like.

The term (8) "type of package" refers to a lead frame type or a substrate type.

TABLE 1

Reflectivity of metal material of metal film 70

| Metal material | Reflectivity (%)* |
|---|---|
| Ag | 97 |
| Ag—In (Ag:In = 95:5) | 93 |
| Ag—Au (Ag:Au = 85:15) | 92 |
| Al | 92 |
| Au | 39 |

*reflectivity to light having wavelength of 450 nm

In all samples for measurements, blue light emitting diodes (emission wavelength λ=453 nm) are used as the light emitting elements 10.

<C. Measurement of Output of Samples>

Output of each sample for measurement is obtained by energizing the sample with 400 mA and measuring its luminous flux by using an integrating sphere.

The results of the measurements will be discussed below. The values shown in "output (%)" are relative output values of the light emitting devices when the output of the standard light emitting device (comparative example 1 to be described later) is regarded as 100%.

<1. Effect of Metal Film 70 Coating>

Relation between the manufacturing conditions of the light emitting devices and the effect of the metal coating 70 is summarized in Table 2. (Ag) indicated in the row "Covering Materials of Lead Terminals" and under the columns Example 1 and Example 3 implies that the lead terminals 301, 302 are not covered before mounting the light emitting elements 10, but the metal film 70 is subsequently applied, so that the lead terminals 301, 321 of the obtained light emitting device 1 are covered with the Ag film. Further, the conductive wire used in Comparative Example 4 is a composite wire in which an Au core material is covered with an Ag film and (Ag) indicated in the row "Material of metal film" implies that the composite wire is covered with an Ag film.

Preparation conditions excluded in the table are: Number of mounted light emitting elements: 6, Number of wires: 2 per element, Wiring type of conductive wires: triangular loop wiring, Surface treatment: none, and Package type: lead frame type.

TABLE 2

Table 2: Comparison of covering effect of metal film 70

|  | Example 1 | Example 2 | Example 3 | Comparative Example 1 | Comaparative Example 2 | Comparative Example 3 | Comparative Example 4 |
|---|---|---|---|---|---|---|---|
| Coating material of lead terminal | (Ag) | Ag | (Ag) | Ag | None | None | Ag |
| Material of conductive wire | Au | Au | Cu | Au | Au | Cu | Au/Ag |
| Material of metal film | Ag | Ag | Ag | None | None | None | (Ag) |
| output (%) | 115 | 115 | 115 | 100 | 82 | 80 | 105 |
| other |  |  |  |  |  |  | Composite wire |

Figure 14:
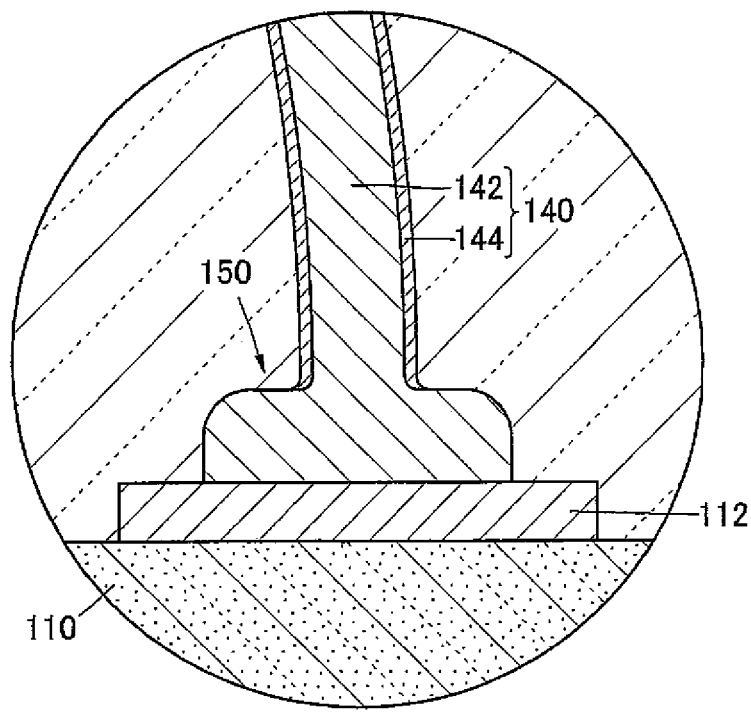
FIG. 14 is a partially enlarged view illustrating a wire bonding structure of a conventional light emitting device.

In comparison of Example 1 (metal film: Ag) and Comparative Example 2 (metal film: none), the output of the light emitting device 1 is about 1.4 times higher in Example 1 (115%) than in Comparative Example 2 (82%), by covering the current-carrying members such as the conductive wires 40 and lead terminals 301, 321 with an Ag film. In comparison of Example 1 and Comparative Example 4 (a composite wire of Au core material/Ag film), a higher output is obtained in the case where an electroplating of Ag film is applied after wire bonding Au wires than in the case where a composite wire is employed. This is considered that in Comparative Example 4, as shown in FIG. 14 and FIG. 15, the core material 142 is exposed from the first bond 150, the second bond 160, and an end surface 162 of the wire and absorbs light.

In comparison of Comparative Example 1 (lead terminal: Ag-plated) and Comparative Example 2 (lead terminal: no plated), the light extraction efficiency of the light emitting device is improved by previously applying a metal plating using Ag or the like on the lead electrodes 30, 32. However, in comparison of Example 1 (lead terminal: no plated) and Example 2 (lead terminal: Ag plated), comparable outputs (115%) were obtained. This is due to the fact that, in the light emitting device 1 of Example 1, when the Ag film 70 is disposed after mounting the light emitting elements, the entire current-carrying members are covered with Ag film by way of electro plating, so that the lead terminals 301, 321 which are also current-carrying member are covered with the Ag film.

In comparison of Example 1 (Au wires/Ag-coated), Example 3 (Cu wires/Ag-coated), Comparative Example 2 (Au wires/no Ag coat), and Comparative Example 3 (Cu wires/no Ag coat), in the cases where the Ag film is not disposed and the conductive wires 40 are exposed, the output of the light emitting device 1 varies (Comparative Example 2: 82%, Comparative Example 3: 80%) depending on the kind of the conductive wire 40. But, the light emitting device 1 with a high output (Example 1 and Example 3: 115%) can be obtained with the conductive wire 40 covered with the metal film 70, regardless of the material of the conductive wire 40.

<2. Material of Metal Film 70>

The effect of material of the metal film 70 is summarized in Table 3.

Preparation conditions excluded in the table are: Covering material of lead terminal: Ag, Material of conductive wire: Au, Number of mounted light emitting elements: 6, Number of wires: 2 per element, Wiring type of conductive wires: triangular loop wiring, Surface treatment: none, and Package type: lead frame type.

TABLE 3

Comparison of effects of materials of metalfilm 70

|  | Example 2 | Example 4 | Example 5 | Example 6 | Comapartive Example 1 |
|---|---|---|---|---|---|
| Material of metal film | Ag | Al | Ag—In | Ag—Au | None |
| Output (%) | 115 | 111 | 110 | 105 | 100 |

Examples 2 and 4 to 6 concern the light emitting devices in which the metal film 70 are made of different materials, respectively. Referring to Table 1 and Table 3, a highest output (115%) is obtained in the device according to Example 2 in which the metal film 70 is made of Ag having a high reflectivity, and the output of the light emitting device 1 decreases as the reflectivity of the metal material decreases (Example 4: 111%, Example 5: 110%, Example 6: 105%). However, if the metal material has a reflectivity of 90% or more (Examples 4 to 6), a higher output can be obtained than the light emitting device lacking the metal film 70 (Comparative Example 1).

<3. Number of Mounted Light Emitting Elements 10, and Number of Conductive Wires>

The effect of metal film 70 is summarized in Table 4, with regard to arrangements in which two conductive wires 40 are connected to a light emitting element as in FIG. 1 and in which one conductive wire 40 is connected to a light emitting element as in FIG. 12.

In the table, "Rate of Change of Output" is output $P_2$ of the light emitting device 1 having a metal film divided by output $P_1$ of the light emitting device 1 lacking a metal film.

Preparation conditions excluded in the table are:
Covering material of lead terminal: Ag, Material of conductive wire: Au, Material of metal film: Ag, Wiring type of conductive wires: triangular loop wiring, Surface treatment: none, and Package type: lead frame type.

TABLE 4

Comparison of effects of the number of mounted light emitting elements and the number of conductive wires

| Number of mounted light emitting elements Unit/light emitting device | Number of conductive wires Piece/light emitting device | Output (%) | | Rate of output change $P_2/P_1$ |
|---|---|---|---|---|
| | | No metal film $P_1$ | With metal film $P_2$ | |
| 1 | 1 | 21 (Comparative Example 5) | 22 (Example 7) | 1.05 |
| 1 | 2 | 20 (Comparative Example 6) | 21 (Example 8) | 1.05 |
| 3 | 3 | 53 (Comparative Example 7) | 56 (Example 9) | 1.06 |
| 3 | 6 | 50 (Comparative Example 8) | 56 (Example 10) | 1.12 |
| 6 | 6 | 108 (Comparative Example 9) | 115 (Example 11) | 1.06 |
| 6 | 12 | 100 (Comparative Example 1) | 115 (Example 2) | 1.15 |
| 12 | 12 | 228 (Comparative Example 10) | 273 (Example 12) | 1.2 |
| 12 | 24 | 195 (Comparative Example 11) | 273 (Example 13) | 1.4 |

Improvement in output due to formation of the metal film 70 is observed regardless of the number of mounted light emitting elements 1. Improvement in output was greater as the number of mounted light emitting elements 1 increases. The total length of the conductive wires 40 increases as the number of mounted light emitting elements 1 increases. Therefore, it is considered that the effect of the metal film 70 becomes significant.

Moreover, when the metal film 70 is formed an increase in output was observed regardless of the number of conductive wires 40. Improvement in output tends to be greater as the number of conductive wires 40 increases. The total length of the conductive wires 40 increases as the number of conductive wire 40 increases. Therefore, it is considered that the effect of the metal film 70 becomes significant. But, even if the number of conductive wires is the same, the rate of increase of output may be different. This is presumed that the length of each conductive wire 40 may vary due to the arrangement of the light emitting elements 1 and the lead terminals (see FIG. 1), so that the number of conductive wires 40 and the total length of the conductive wires 40 may not be directly proportional.

<4. Wiring Type of Conductive Wires>

Effects of the metal film 70 on a triangular loop wiring as in FIG. 1 and on a stitch wiring as in FIG. 12 are summarized in Table 5.

Preparation conditions excluded in the table are:

Covering material of lead terminal: Ag, Material of conductive wire: Au, Material of Metal Film: Ag, Number of mounted light emitting elements: 6, Number of wires: 2 per element, Surface Treatment: none, and Package Type: lead frame type.

TABLE 5

Comparison of effects of wiring type of conductive wires

| | Comparative Example 1 | Example 2 | Comparative Example 12 | Example 14 |
|---|---|---|---|---|
| Wiring type | Triangular loop wiring | | Stitch wiring | |
| Metal film | Absence | Presence | Absence | Presence |
| Output (%) | ($P_1$)100 | ($P_2$)115 | ($P_1$)92 | ($P_2$)115 |
| Rate of output change ($P_2/P_1$) | 1.15 | | 1.25 | |

In stitch wiring, although the total length of the conductive wire 40 to be used can be shortened, the length of the conductive wire 40 placed over the light emitting surface of the light emitting element 10 increases (that is, the conductive wire provided at a position from where it easily absorbs light), so that the output of a case lacking the metal film 70 is low. Therefore, it is considered that the effect of applying metal film 70 is significant in stitch wiring. As shown in the table, comparable outputs were obtained with either wiring arrangements after the metal films 70 were applied respectively.

<5. Formation of Coating Film on Surface of Metal Film 70 and Effect of Metal Film 70 made of Alloy on Device Durability>

Device durability is examined on the samples (Examples 15 and 16) with a coating film formed on the surface of the metal film 70, and the samples (Example 6) in which an Ag-alloy (Ag—Au alloy) is used for the metal film 70. For comparison, Comparative Example 1 (no metal film) and Example 2 (with an Ag film) are also examined. Examination is conducted at 85° C., under energization at 400 mA for 1000 hours. As output, luminous flux of the light emitting device is measured by using an integrating sphere. The luminous flux at the start of operation (time length of operation: 0 hour) is set as 100% and decrease in outputs after 1000 hours of operation are compared. $SiO_2$ film is used as the inorganic coating in Example 15. The film is formed by dropping an organosilicon compound on the surface of the metal film 70 and applying heat thereon. An epoxy resin is used for the organic coating in Example 16. The resin film is formed by dropping the resin on the surface of the metal film and applying heat thereon.

Preparation conditions excluded in the table are:

Covering Material of Lead Terminal: Ag, Material of Conductive Wire: Au, Number of mounted light emitting elements: 6, Number of wires: 2 per element, Wiring Type of conductive wires: triangular loop wiring, and Package Type: lead frame type.

TABLE 6

Effect on durability by surface treatment of metal film

|  | Comparative Example 1 | Example 2 | Example 6 | Example 15 | Example 16 |
|---|---|---|---|---|---|
| Material of metal film | None | Ag | Ag—Au film | Ag film | Ag film |
| Coating film | None | None | None | Inorganic coating | Organic coating |
| Output at operation (%) ($P_3$) | 100 | 115 | 105 | 115 | 115 |
| Output after 1000 hours (%) ($P_4$) | 80 | 81 | 103 | 112 | 98 |
| Rate of output change ($P_4/P_3$) | 0.8 | 0.7 | 0.98 | 0.97 | 0.85 |

The greatest decrease in output is observed in Example 2 in which an Ag film 70 is formed, and the next greatest decrease in output is observed in Comparative Example 1 in which a metal film 70 is not formed. Decrease in output is suppressed in any samples provided with the coating film, and a significant effect to suppress decrease of output is observed with an inorganic coating. In addition, Example 6 in which a silver alloy film is formed exhibits a high effect of suppressing the decrease in output, comparable to that in the sample provided with an inorganic coating. This result is attributed to discoloration due to sulfuration of the Ag film, resulting in a great decease in output in a long period. The significant reduction in output in Example 2 compared to that in Comparative Example 1 is inferred that the effect of reduction in output due to discoloration of the Ag film is more pronounced, because the lead terminals are covered with the Ag film in Comparative Example 1, while the conductive wires are also covered with the Ag film in addition to the lead electrodes in Example 2. Moreover, it is considered that the discoloration of the Ag film due to sulfuration or the like is suppressed by applying the coating film on the Ag film, and a reduction in output becomes difficult to occur even through a long time operation. It is considered that sulfuration or the like is difficult occur in an Ag alloy, so that discoloration does not occur even a coating film has not applied, and the output is hardly decreased.

<6. Difference in Effect of Package Type>

Effect of metal film 70 with three types of packages (lead frame, ceramic substrate, and glass epoxy substrate) is summarized in Table 7.

Preparation conditions excluded in the table are: Covering Material of Lead Terminal: Ag, Material of Conductive Wire: Au, Number of mounted light emitting elements: 6, Number of wires: 2 per element, Wiring Type of conductive wires: triangular loop wiring, and Surface Treatment: none.

TABLE 7

|  | Comparative Example 6 | Example 8 | Comparative Example 13 | Example 17 | Comparative Example 14 | Example 18 |
|---|---|---|---|---|---|---|
| Package type | lead frame | | Ceramic substrate | | Glass epoxy substrate | |
| Material of metal film | None | Ag | None | Ag | None | Ag |
| Output (%) | ($P_1$) 20 | ($P_2$) 21 | ($P_1$) 18 | ($P_2$) 19 | ($P_1$) 20 | ($P_2$) 21 |
| Rate of output change ($P_2/P_1$) | 1.05 | | 1.05 | | 1.05 | |

As shown in Table 7, improvement in output is observed in all type of packages having the metal film 70.

INDUSTRIAL APPLICABILITY

The light emitting device in accordance with the present invention can be utilized for various light sources such as illumination, various indicators, in-vehicle light source, display, backlight of liquid crystal, censor, traffic light, in-vehicle component, and channel letter and advertising lighting.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

This application is based on applications No. 2007-195859 filed in Japan on Jul. 27, 2007, and No. 2008-183817 filed in Japan on Jul. 15, 2008, the contents of which are incorporated hereinto by reference.

What is claimed is:

1. A light emitting device comprising a conductive wire for electrically connecting an electrode of a light emitting element to an electrically conductive member; wherein
   an outer surface of the conductive wire at a bonding portion between the conductive wire and at least one of the electrode of the light emitting element and the electrically conductive member is covered with a metal film, and
   reflectivity of the metal film is higher than reflectivity of the conductive wire at a emission peak wavelength of the light emitting element.

2. The light emitting device according to claim 1, wherein at the bonding portion, the metal film continuously covers a region from a surface of the electrode or a surface of the electrically conductive member to a surface of the conductive wire.

3. The light emitting device according to claim 1, wherein at least one end portion of the conductive wire is in a ball shape, and
the end portion of the ball shape has a shape of crushed ball.

4. The light emitting device according to claim 1, wherein at least one end surface of the conductive wire is covered with the metal film.

5. The light emitting device according to claim 1, wherein the metal film includes a metal material containing an Ag alloy, or includes Ag.

6. A light emitting device comprising a conductive wire for electrically connecting an electrode of a light emitting element to an electrically conductive member; wherein
an outer surface of the conductive wire at a bonding portion between the conductive wire and at least one of the electrode of the light emitting element and the electrically conductive member is covered with a metal film, and
reflectivity of the metal film is higher than reflectivity of the conductive wire at a emission peak wavelength of the light emitting element, and
the light emitting element is mounted face-up.

7. The light emitting device according to claim 5, wherein emission peak wavelength of the light emitting element is in a range of 400 nm to 530 nm, and
the conductive wire includes a metal material containing one selected from the group consisting of Au, Cu, Al, W, and stainless steel.

8. The light emitting device according to claim 5, wherein a surface of the metal film is further covered with a coating film.

9. The light emitting device according to claim 6, wherein
the metal film includes a metal material containing an Ag alloy, or includes Ag,
a surface of the metal film is further covered with a coating film, and
the coating film further covers the light emitting element.

10. The light emitting device according to claim 6,
wherein the metal film includes a metal material containing an Ag alloy, or includes Ag, and
wherein a surface of the metal film is further covered with a coating film, and
further comprising a package having a recess,
wherein the conductive member includes an inner conductive portion exposed in the recess and an external conductive portion extending from the inner conductive portion through the package and protruding outwardly from the package, and
the coating film extends from the surface of the metal film to cover an inner surface defining the recess and a surface of the inner conductive portion.

11. The light emitting device according to claim 10, wherein the coating film extends from the surface of the metal film to cover an outer surface of the package and a surface of the external conductive portion.

12. The light emitting device according to claim 6, wherein the metal film includes a metal material containing an Ag alloy, or includes Ag,
further comprising a sealing resin sealing the light emitting element, wherein
a surface of the sealing resin is covered with the coating film.

13. The light emitting device according to claim 8, wherein the coating film is made of an inorganic coating or an organic coating.

14. The light emitting device according to claim 1, wherein at the bonding portion, the metal film is continuously applied from a surface of the electrode or a surface of the electrically conductive member through an outer border of a bonded surface of the bonded portion to a surface of the conductive wire.

15. The light emitting device according to claim 1, wherein an entire outer surface of the conductive wire is covered with the metal film.

16. The light emitting device according to claim 1, wherein emission peak wavelength of the light emitting element is in a range of 400 nm to 530 nm, and
the conductive wire includes a metal material containing one selected from the group consisting of Au, Cu, Al, W, and stainless steel.

17. The light emitting device according to claim 6, wherein at the bonding portion, the metal film is continuously applied from a surface of the electrode or a surface of the electrically conductive member to a surface of the conductive wire.

18. The light emitting device according to claim 6, wherein at least one end portion of the conductive wire is in a ball shape, and
the end portion of the ball shape has a shape of crushed ball.

19. The light emitting device according to claim 6, wherein at least one end surface of the conductive wire is covered with the metal film.

20. The light emitting device according to claim 6, wherein the metal film includes a metal material containing an Ag alloy, or includes Ag.

21. The light emitting device according to claim 6, wherein emission peak wavelength of the light emitting element is in a range of 400 nm to 530 nm, and
the conductive wire includes a metal material containing one selected from the group consisting of Au, Cu, Al, W, and stainless steel.

22. The light emitting device according to claim 20, wherein emission peak wavelength of the light emitting element is in a range of 400 nm to 530 nm, and
the conductive wire includes a metal material containing one selected from the group consisting of Au, Cu, Al, W, and stainless steel.

* * * * *